United States Patent [19]
Nakamura et al.

[11] Patent Number: 5,459,684
[45] Date of Patent: Oct. 17, 1995

[54] DYNAMIC RAM, DYNAMIC RAM PLATE VOLTAGE SETTING METHOD, AND INFORMATION PROCESSING SYSTEM

[75] Inventors: Masayuki Nakamura, Akishima; Tetsuro Matsumoto, Higashiyamato; Kazuyoshi Oshima, Ohme, all of Japan

[73] Assignee: Hitachi, Ltd., Tokyo, Japan

[21] Appl. No.: 197,768

[22] Filed: Feb. 16, 1994

[30] Foreign Application Priority Data

Feb. 19, 1993 [JP] Japan .................................. 5-055111

[51] Int. Cl.$^6$ .......................... G11C 7/00; G11C 11/40
[52] U.S. Cl. ................... 365/149; 365/201; 365/225.7; 365/189.09
[58] Field of Search ..................... 365/149, 201, 365/225.7, 189.01, 189.09, 230.03

[56] References Cited

U.S. PATENT DOCUMENTS

| | | | |
|---|---|---|---|
| 4,839,865 | 6/1989 | Sato et al. ............................... | 365/201 |
| 5,274,586 | 12/1993 | Matsukawa ............................. | 365/149 |
| 5,317,532 | 5/1994 | Ochii ...................................... | 365/149 |

FOREIGN PATENT DOCUMENTS 59-54097  3/1984  Japan .

OTHER PUBLICATIONS

H. Shinriki et al., "UV–O$^3$ and Dry–O$_2$: Two–Step Annealed Chemical Vapor–Deposited Ta$_2$O$_5$ Films for Storage Dielectrics of 64–Mb DRAM's", IEEE Transactions on Electron Devices, vol. 38, No. 3, Mar. 1991.

*Primary Examiner*—David C. Nelms
*Assistant Examiner*—Huan Hoang
*Attorney, Agent, or Firm*—Antonelli, Terry, Stout & Kraus

[57] ABSTRACT

A dynamic RAM enhanced in integration and storage capacity, a method of setting a plate voltage of the dynamic RAM, and an information processing system reduced in size and enhanced in performance are provided. The plate voltage is set such that a leakage current of an information storage capacitor when a bit line voltage is positive relative to the plate voltage is made substantially equal to a leakage current of the capacitor when the bit line voltage is negative relative to the plate voltage. For this plate voltage setting, a plate voltage generating circuit is provided with an output voltage adjusting capability. A monitoring capacitor is formed on the same semiconductor wafer on which the information storage capacitor is formed. This monitoring capacitor is formed by a same method by which the information storage capacitor is formed, and is made of a same material of which the information storage capacitor is made. The monitoring capacitor is tested in a wafer probing process. Based on a measurement result, the plate voltage is set to an optimum level. The information processing system is constituted with the dynamic RAM as its memory device having the optimum plate voltage.

14 Claims, 12 Drawing Sheets

5,459,684

DYNAMIC RAM, DYNAMIC RAM PLATE VOLTAGE SETTING METHOD, AND INFORMATION PROCESSING SYSTEM

BACKGROUND OF THE INVENTION

The present invention relates to a dynamic RAM (Random Access Memory) formed on a single semiconductor substrate, a method of setting a plate voltage of the dynamic RAM and an information processing system that uses the plate voltage setting method, and to a technology effectively for use on a dynamic memory device having an information storage capacitor using a highly dielectric film, by way of example.

A voltage equivalent to a half precharge voltage VCC/2 of a bit line (a data line or a digit line) is applied to a plate of an information storage capacitor of a dynamic memory cell contained in a dynamic RAM device formed on a single semiconductor substrate. Japanese Patent Laid-open No. 59-54097 discloses a dynamic RAM device with the plate voltage being the half precharge voltage. Recently, use of a highly dielectric film on the information storage capacitor is under examination to make integration of the dynamic RAM higher than before for an increased storage capacity.

SUMMARY OF THE INVENTION

Paying attention to the fact that, on a highly dielectric film, a leakage current density depends on a polarity of an applied voltage, we have made an investigation into enhancing an efficiency of a storage operation of a dynamic memory cell with the highly dielectric film used as its information storage capacitor.

It is therefore an object of the present invention to provide a dynamic RAM (hereinafter also referred to as a dynamic random access memory or a dynamic memory device or a DRAM) enhanced in integration and storage capacity and a method of setting a plate voltage of the dynamic memory device.

Another object of the present invention is to provide an information processing system reduced in size and enhanced in performance.

These and other objects and features of the invention will be apparent from the following description with reference to accompanying drawing.

Of the inventions disclosed in this application, a representative one will be outlined as follows. On the dynamic memory device, a voltage is applied as its plate voltage, which makes generally equal a leakage current of an information storage capacitor contained in the device produced when a potential of a bit line is positive relative to the plate voltage and a leakage current produced when the potential is negative. Further, in setting the plate voltage, a plate voltage generating circuit is provided with an output voltage adjusting capability to measure, in a wafer probing process, a monitoring capacitor formed on a semiconductor wafer on which the information storage capacitor is also formed, the monitoring capacitor being manufactured by a same process and from a same material as those of the information storage capacitor. According to a measurement result, the plate voltage is set to an optimum value by the output adjusting capability, which is meant for varying a plate voltage level. In addition, the information processing system is constituted based on a dynamic memory device having the plate voltage set to the above-mentioned level.

According to the above-mentioned method, a substantial leakage current is reduced, thereby reducing the size of the information storage capacitor or, conversely, increasing a substantial storage capacity in unit area. This in turn enhances the integration and storage capacity of the dynamic memory device. Additionally, the dynamic memory device reduced in size and increased in storage capacity reduces the size and enhances the performance of the information processing system containing the dynamic memory device.

DESCRIPTION OF THE PREFERRED EMBODIMENTS

Figure 1:
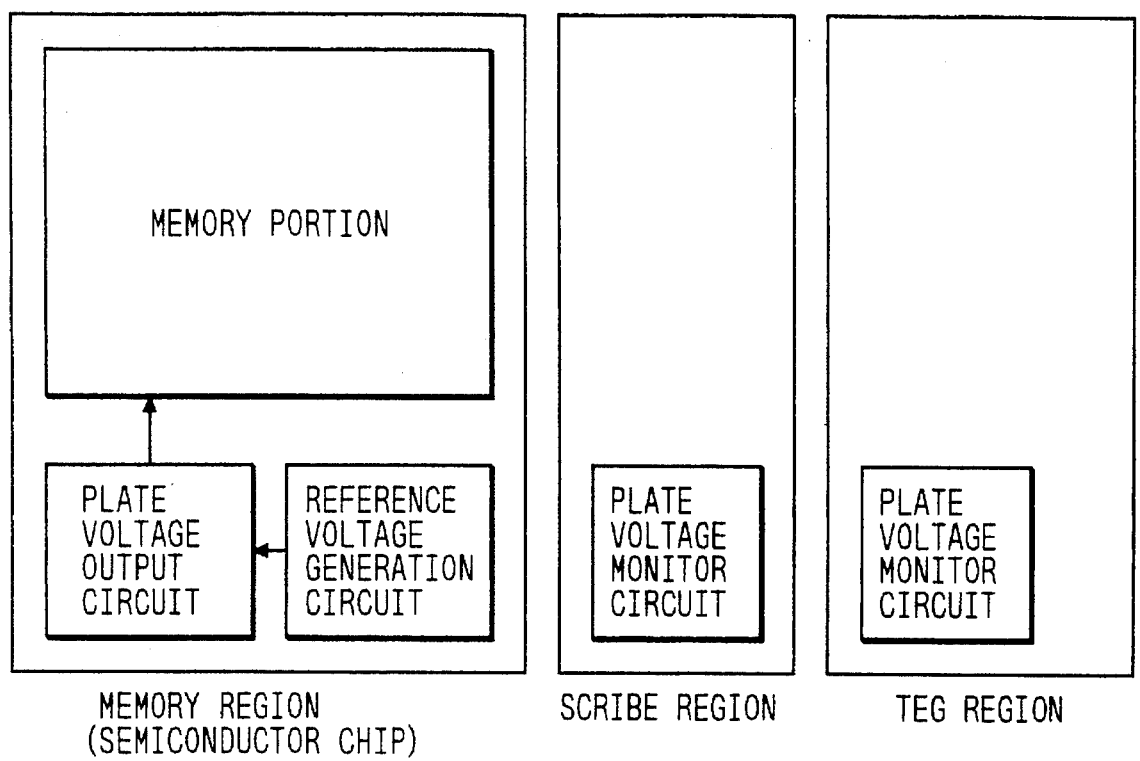
FIG. 1 is a diagram outlining a dynamic RAM completely formed on a wafer, practiced as a preferred embodiment of the invention.

FIG. 1 is a schematic diagram illustrating a portion of a wafer made of a silicon single crystal semiconductor for example on which the dynamic RAM according to the invention is formed. The figure shows a semiconductor chip having a memory portion and the like constituting the dynamic RAM (a memory region), a TEG (Test Element Group) region formed for testing, and a scribe region for separating semiconductor chips from the wafer.

Formed on the semiconductor chip (the memory region) are the memory portion, a reference voltage generating circuit, and a plate voltage output circuit which receives a reference voltage from the reference voltage generating circuit to generate a plate voltage which is supplied to a plate of a dynamic memory cell formed on the memory portion. The reference voltage generating circuit or the plate voltage output circuit is provided with a plate voltage adjusting capability to be described later.

On the wafer on which the above-mentioned semiconductor chip is formed, a plate voltage monitoring circuit is formed on a scribe line (scribe region). The plate voltage monitoring circuit may alternatively be provided on the TEG region. The plate voltage monitoring circuit is formed with a monitoring capacitor made of the same material as that of an information storage capacitor of a dynamic memory cell to be described later and manufactured by the same process as that of the information storage capacitor.

Figure 2A:
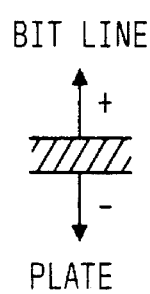
FIG. 2(A) and FIG. 2(B) are schematic diagrams illustrating a monitoring capacitor to be used in a plate voltage monitoring circuit practiced as a preferred embodiment of the invention.
Figure 2B:
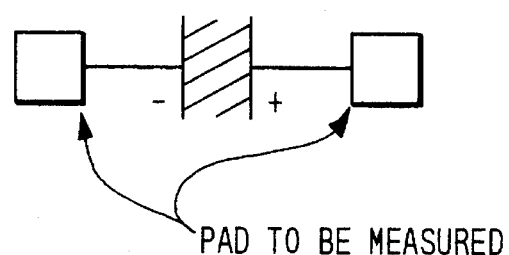

FIG. 2(A) and FIG. 2(B) show configurations of a monitoring capacitor to be used; the above-mentioned plate voltage monitoring circuit practiced as a preferred embodiment of the invention. FIG. 2(A) shows a polarity of the monitoring capacitor, while FIG. 2(B) shows a circuit of the capacitor. As shown in FIG. 2(A), the monitoring capacitor has a pole corresponding to a bit line which is positive, (+) and another pole corresponding to the plate which is negative (−). The monitoring capacitor thus constituted is made of the same material as that of the information storage capacitor of the memory cell formed on the memory portion of the semiconductor chip constituting the dynamic RAM and is manufactured by the same process as that used to manufacture the information storage capacitor. The size of the monitoring capacitor is also generally the same as that of the memory cell. Preferably, the monitoring capacitor is formed with a field insulating film and an address selecting MOSFET as with the memory cell. Referring to FIG. 2(B), the monitoring capacitor is formed with pads for measurement.

Figure 3:
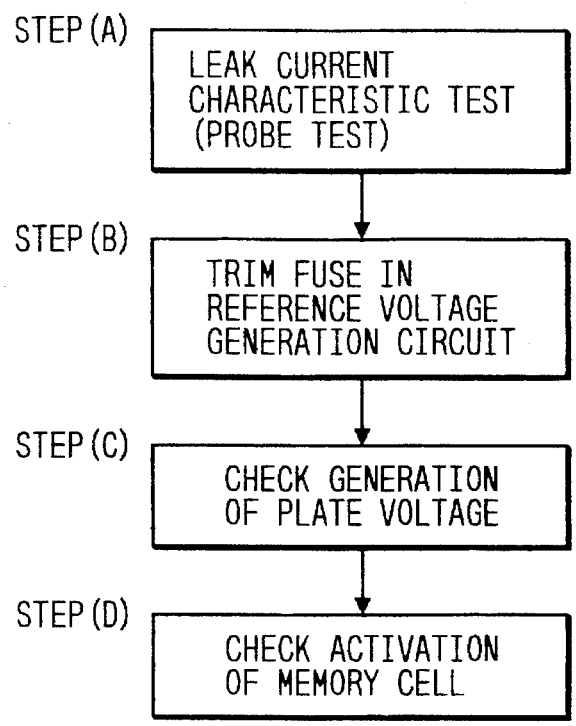
FIG. 3 is a flowchart describing a method of setting the plate voltage, practiced as a preferred embodiment of the invention.

FIG. 3 shows a flowchart for describing a method of setting the above-mentioned plate voltage. A probing test is performed after forming of the above-mentioned dynamic-RAM-constituting semiconductor chips disposed on the wafer checkerwise and of the TEG region on a part of the wafer. In the probing test, before performing dynamic RAM's DC and AC tests, a leakage current characteristic test is performed using the monitoring capacitor provided on the scribe line or the TEG region.

Namely, a positive voltage is applied to the monitoring capacitor of FIG. 2(B) at the positive (+) side to obtain a voltage value at the positive side when a predetermined leakage current flows. Then, the positive voltage is applied to the monitoring capacitor at the negative (−) side to obtain a negative-side voltage when the above-mentioned leakage current flows. Based on the above-mentioned two voltages obtained, an optimum plate voltage is obtained. This is a step A.

Then, in order to make a voltage value of a plate voltage generated by a plate voltage output circuit to be equal to the optimum plate voltage obtained in the step A above, a fuse providing means for reference voltage setting incorporated in the reference voltage generating circuit for providing the reference voltage VREF having a predetermined value to the plate voltage output circuit is trimmed. This is step B. It should be noted that this trimming is not required in some cases.

It is determined whether the plate voltage is equal to the optimum plate voltage obtained in the step A. This is a step C.

Finally, it is tested whether the dynamic memory cell contained in the memory portion to which the above-mentioned optimum voltage is supplied is operating normally or not. This is a step D.

Sometimes, due to process fluctuations, the optimum plate voltage differs from a semiconductor chip to another. If this happens, following a step of FIG. 3 allows the optimum plate voltage to be set to each semiconductor chip individually.

Figures 4A, 4B:
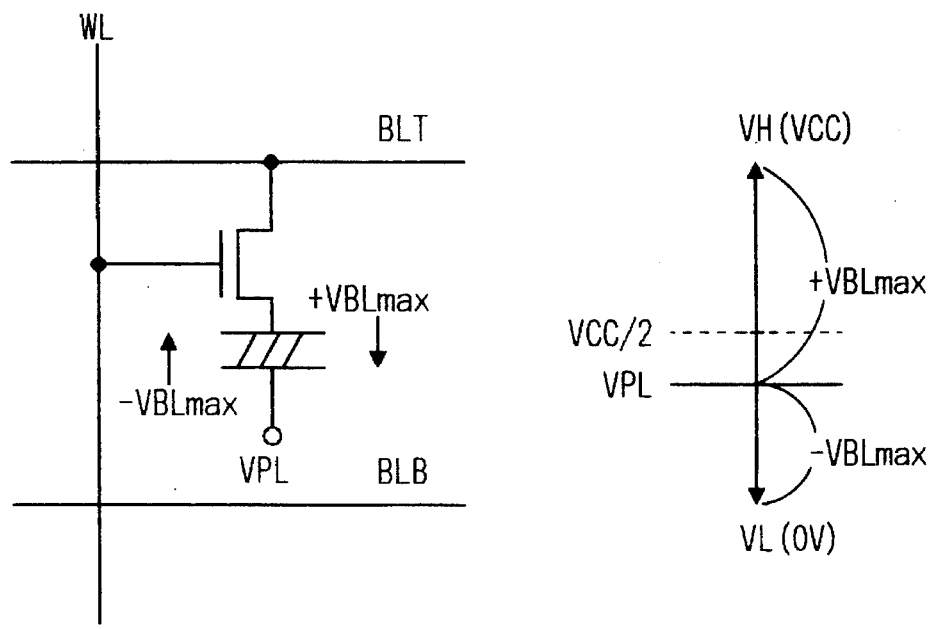
FIG. 4(A) and FIG. 4(B) are schematic diagrams describing a plate-voltage setting method according to the invention.

FIG. 4(A) and FIG. 4(B) are schematic diagrams describing the plate-voltage setting method according to the invention. FIG. 4(A) shows a circuit diagram of the memory cell, while the FIG. 4(B) shows a relationship between potentials of the memory cell.

The memory cell of FIG. 4(A) is composed of an address selecting MOSFET and an information storage capacitor like the conventional dynamic memory cell. A gate of the address selecting MOSFET is connected to a word line WL. One end of a source-drain path of the MOSFET is connected to a bit line BLT, while the other end constituting a storage node is connected to one of poles (a first pole) of the information storage capacitor. The other pole (a second pole) is supplied with the plate voltage VPL.

The bit line in this embodiment is based on a loop bit line scheme consisting of a pair of complementary bit lines BLT and BLB extending in parallel, but not limited thereto. The memory cell is connected at an intersection with the word line to one of the complementary bit lines BLT and BLB.

For the information storage capacitor, a highly dielectric film is used to provide a relatively larger capacity in a relatively smaller occupying area. When the highly dielectric film is used, there is a difference between the maximum positive high-level write voltage from the bit line and the maximum negative low-level write voltage from the bit line when generally the same leakage current flows. Based on this difference, the plate voltage VPL is set.

That is, as shown in FIG. 4(B), the plate voltage VPL is determined so that a voltage value obtained by adding absolute values of the $+VBL_{max}$ and the $-VBL_{max}$ when generally the same leakage current flows becomes a bit line high level VH (VCC). Normally, since the bit line high level VH is determined from a supply voltage VCC, the plate voltage may be determined so that the above-mentioned voltage value obtained by adding the absolute values of the $+VBL_{max}$ and the $-VBL_{max}$ becomes generally equal to the supply voltage VCC in an allowable range in which the leakage current is obtained from a relation such as a refresh cycle.

When an internal circuit of the dynamic RAM is operated by an internal voltage generated by an internal voltage generating circuit as will be described, the $+VBL_{max}$ and the $-VBL_{max}$ may be obtained within the allowable range of the leakage current and the voltage obtained by adding their absolute values may be used as a reference voltage to set the operating voltage VCC for the above-mentioned internal circuit.

Figure 5A:
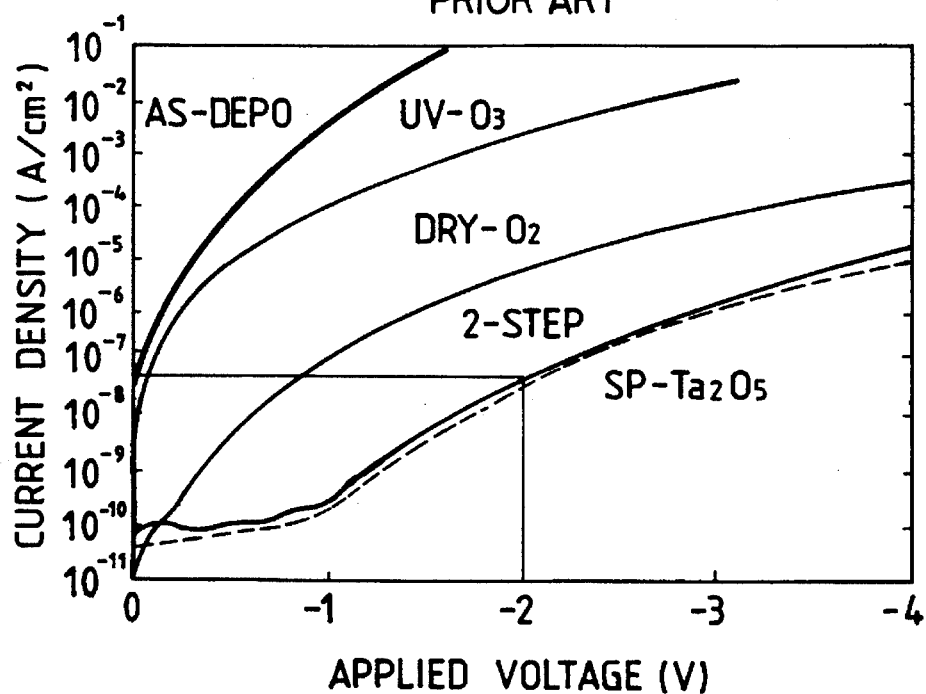
FIG. 5(A) and FIG. 5(B) are characteristics diagrams illustrating a relationship between an applied voltage and a leakage current on a highly dielectric film.
Figure 5B:
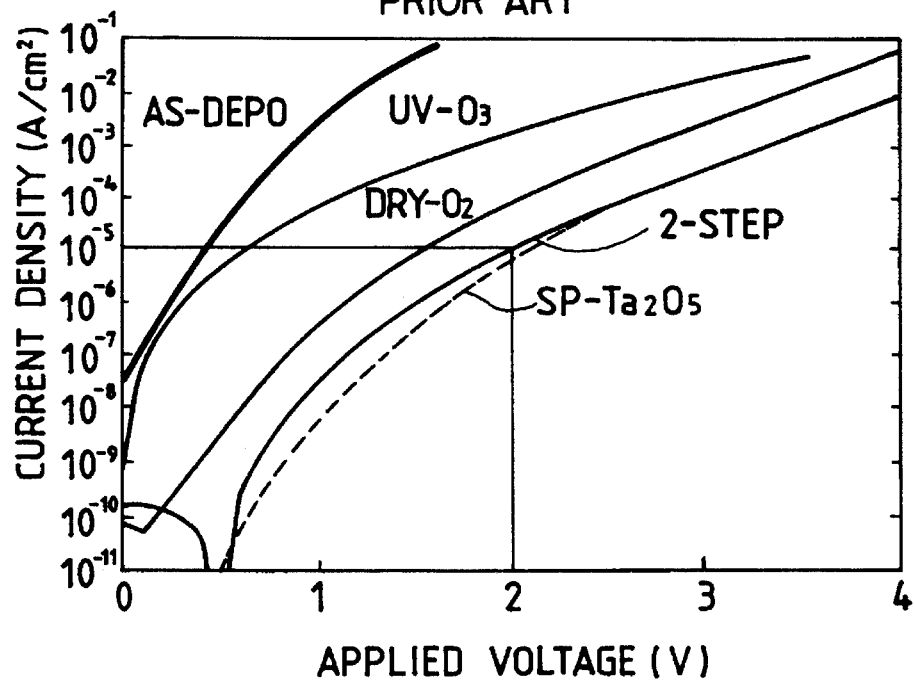

FIG. 5(A) and FIG. 5(B) are characteristics diagrams illustrating a relationship between an applied voltage and a leakage current on the highly dielectric film. FIG. 5(A)

shows a leakage current characteristic obtained when a negative voltage is applied, when FIG. 5(B) shows a leakage current characteristic obtained when a positive voltage is applied. These characteristics are reported in the IEEE Transaction on Electron Device, Vol. 38, No. 3, pp. 455–462. Highly dielectric films shown in these figures include $UV-O_3$, $DRY-O_2$, 2-STEP, and $SP-Ta_2O_5$.

In the case of the memory cell, a relaxation film such as a silicon oxide film or silicon nitride film for leakage current reduction and film stress relaxation is provided on the storage node (polysilicon for example) connected to the address selecting MOSFET and on the above-mentioned $Ta_2O_5$ or $SrTiO_3$, so that the leakage current of the capacitor inherently has directionality. For example, taking voltages +2 V and −2 V, the 2-STEP highly dielectric film presents a leakage current of about $10^{-5}$ $A/cm^2$ on the positive voltage side, while it is about $10^{-7}$ $A/cm^2$ on the negative voltage side, a difference by as large as two digits, thereby proving existing of the directionality.

Like the conventional dynamic memory cell, if the plate voltage is set to a midpoint voltage (VCC/2) between the high level VH and low level VL of the bit line, an information retaining time of the memory cell is always defined by the worst-side leakage current. Therefore, according to the invention, a voltage is obtained so that the above-mentioned positive and negative voltages produce a same leakage current to determine the optimum plate voltage VPL based on the obtained voltage. This setup makes the memory cell information retaining time substantially longer than that of the prior-art technology.

In other words, the novel technology reduces an area occupied by the information storage capacitors constituting the memory cell. If the capacitor-occupied area is kept the same as before while setting a refresh cycle so that the information retaining time is made longer, a current consumption is reduced. If the refresh cycle is kept the same, an information volume stored in the memory cell is made greater to make higher an information level appearing on the bit line in a read operation, thereby enhancing operational speed and enlarging a operational margin to advantage.

Figure 6:
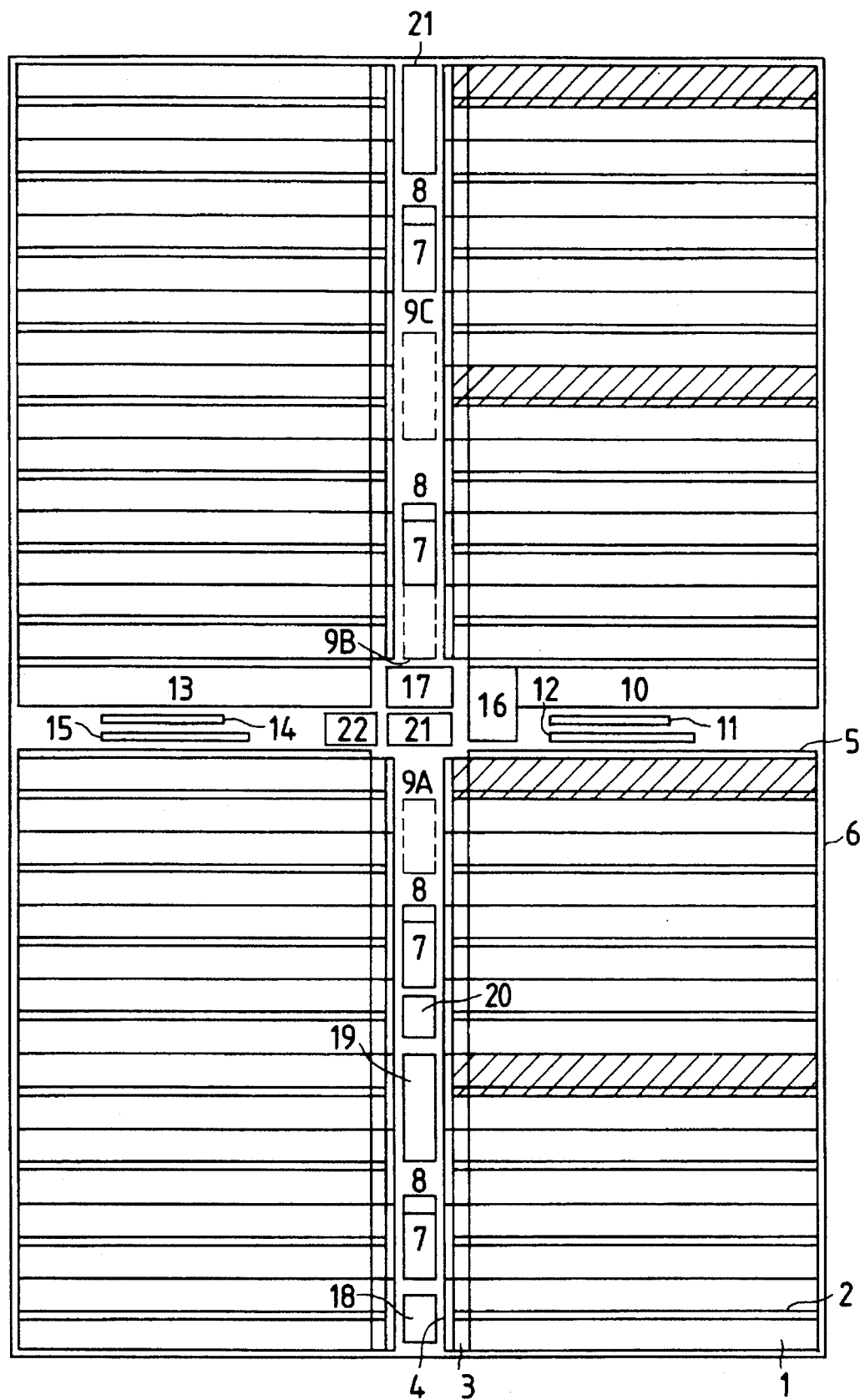
FIG. 6 is a block diagram illustrating a dynamic RAM practiced as a preferred embodiment of the invention.

FIG. 6 shows a block diagram illustrating the dynamic RAM practiced as a preferred embodiment of the invention. Each of circuit blocks in the figure is formed on a same semiconductor substrate such as a silicon single crystal by means of a known semiconductor integrated circuit manufacturing technology. Each circuit block in the figure is drawn such that it fits to a geometrical layout on an actual semiconductor chip. In this patent application, a term "MOSFET" is used to denote an insulated-gate field-effect transistor (IGFET).

In this embodiment, a layout of a memory array constituting the RAM and a layout of a peripheral portion for selecting a memory array address are arranged as described below to prevent an operational speed of the RAM from being delayed by elongated wirings of control and memory array drive signals caused by enlarged chip size required by increased storage capacity.

Referring to FIG. 6, a central circuit column and a central circuit row form a cross-shaped area in the center of the chip. This cross-shaped area is mainly provided with peripheral circuits. Four areas formed by the central circuit column and the central circuit row are disposed with memory arrays. Generally, these four areas are adapted to have a storage size of about four megabits each, but not limited thereto, as will be described later. Accordingly, the four memory arrays store a total of about 16 megabits.

Memory mat 1 is arranged so that a word line extends horizontally and a pair of parallel complementary bit lines (also referred to as data lines or digit lines) runs vertically. The memory mat 1 is arranged in a pair with a sense amplifier 2 in between. This sense amplifier is shared by the memory mats in a pair. This arrangement is known as a shared sense amplifier scheme.

Each of the four memory arrays is provided with a Y-select circuit 5 at the central side of the chip. A Y-select line runs from the Y select circuit 5 over a plurality of memory mats on a corresponding memory array to control switching of a MOSFET gate for a column switch of each of the memory mats.

The right-hand portion of the central circuit row is provided with an X-system circuit 10 composed of an X-address buffer, an X-redundancy circuit and an X-address driver (a logic step), a RAS-system control signal circuit 11, a WE-system signal control circuit 12 and an internal reference voltage generating circuit 16. The internal reference voltage generating circuit 16, arranged near the center of the cross-shaped area, produces, from an external supply voltage such as about 5 V for example, a constant voltage VL such as about 3.3 V for example to be supplied to the internal circuits. The left-hand portion of the central circuit row is provided with a Y-system circuit 13 composed of a Y-address buffer, a Y-redundancy circuit and a Y-address driver (a logic step), a CAS-system control signal circuit 14, and a test circuit 15. Near the center of the cross-shaped area, an internal voltage step-down circuit 17 is provided for producing a power supply voltage VCL to the peripheral circuits such as the address buffer and decoder. In addition, near the chip center, a reference voltage generating circuit 21 and a plate voltage output circuit 22 are disposed.

As mentioned above, if the address buffers, the X- and Y-redundancy circuits including address comparators, and the CAS- and RAS-system control signal circuits are concentratively arranged in one location, it is made possible to dividedly dispose a clock generator and other circuits on both sides of a wiring channel, or make the clock generator and other circuits share the wiring channel, thereby increasing chip integration and transmitting a signal to the address drivers (logic steps) over a shortest path and equidistantly.

The RAS-system control circuit 11 receives a row address strobe signal RASB to activate the X-address buffer. The address signal captured in the X-address buffer is supplied to the X redundancy circuit. In the X redundancy circuit, the address signal is compared with a bad address to determine whether to switch to the redundancy circuit or not. A result of the determination and the above-mentioned address signal are supplied to a predecoder of the X system. The predecoder generates a predecode signal, which is supplied, via X-address drivers provided for each memory array, to an X-decoder 3 provided for each of the above-mentioned memory mats On the other hand, an internal signal of the above-mentioned RAS system is supplied to a WE-system control circuit and a CAS-system control circuit. For example, based on determination of an input sequence of the above-mentioned signal RASB, column address strobe signal CASB and write-enable signal WEB, a mode such as automatic refresh (CBR) or test (WCBR) is identified. In a test mode, the test circuit 15 is activated to set a test function according to a particular address signal supplied at that time.

The CAS-system control circuit 14 receives the signal CASB to generate various Y-system control signals. Address signals captured in the Y-address buffer in synchronization with the signal CASB's going low are supplied to the Y-system redundancy circuit. In the redundancy circuit, the the address signals are compared with a bad address stored in the circuit to determine whether to switch to the redundancy circuit. A result of the determination and the above-mentioned address signals are supplied to a Y-system predecoder. The predecoder generates a predecoder signal. The predecode signal is supplied to each Y-decoder via a Y-address driver provided for each memory array. On the other hand, the above-mentioned CAS-system control circuit 14 receives the signals RASB and WEB to determine a test based on an input sequence of the signals, activating the adjacent test circuit 15.

In the upper half of the above-mentioned chip, 16 horizontal pairs of memory mats and eight horizontal pairs of sense amplifiers are disposed with the central circuit column as the axis of symmetry. A block of four main amplifiers 7 is provided for eight horizontal pairs of memory mats and the corresponding number of sense amplifiers. Additionally, the upper half of the chip has a voltage boosting circuit 21 for generating a predetermined voltage to select a word line based on the above-mentioned internally stepped down voltage and input pad areas 9B and 9C corresponding to input signals including the address and control signals. An internal voltage step-down circuit 8 for generating a voltage to operate the sense amplifiers 2 is provided for each of the four memory blocks.

In the embodiment of FIG. 6, one block has eight horizontal pairs of memory mats 1 and four horizontal pairs of sense amplifiers 2, amounting to a total of 16 memory mats and eight sense amplifiers. In this constitution, the main amplifier block consisting of as few as four amplifiers 7 is used to transmit an amplified signal coming from each sense amplifier 2 to the main amplifiers 7 over a short signal propagation path.

In the lower half of the chip, 16 horizontal pairs of memory mats and eight horizontal pairs of sense amplifiers are disposed with the central circuit column as the axis of symmetry as shown in FIG. 6. A block of four main amplifiers 7 is provided for eight horizontal pairs of memory mats and the corresponding number of sense amplifiers.

Additionally, the lower half of the chip has a substrate voltage generator 18 for generating from the internal stepped down voltage a negative bias voltage to the substrate, an input pad area 9A corresponding to the input signals including the address and control signals, and a data output buffer 19 and a data input buffer 20. Like the constitution of the upper half area of the chip, the main amplifier block consisting of as few as four amplifiers is used to transmit an amplified signal coming from each sense amplifier 2 to the main amplifiers 7 over a short signal propagation path.

Although not shown in FIG. 6, the above-mentioned central circuit column has various types of bonding pads in addition to the above-mentioned areas 9A through 9C. For example, there are a pad for supplying an external power and 10-odd grounding pads aligned generally along s straight line for supplying a circuit ground potential to increase an input level margin, or lower a supply impedance. Ten-odd of this pad are disposed along a generally straight line. These grounding pads are connected to a vertically extending grounding lead formed by means of LOC (Lead On Chip) technology. Of the grounding pads, some are provided especially to prevent floating due to clearing of a word line or coupling of an unselected word line of a word driver, while others are provided as a common source for the sense amplifiers mainly to lower the supply impedance.

The above-mentioned setup lowers the supply impedance of the circuit ground potential of relative to an internal circuit operation and, as described above, the ground wirings of several types connecting internal circuits are connected with a low-pass filter composed of an LOC lead frame and a bonding wire, thereby minimizing noise generation and circuit ground wire noise propagation among the internal circuits.

In the embodiment of FIG. 6, a pad for the external supply VCC of about 5 V for example is provided for each of the above-mentioned voltage step-down circuits 8 and 17 that perform a voltage converting operation. Like the pads mentioned above, this pad also lowers the supply impedance and minimizes voltage noise propagation between the internal circuits (between the VCL, VDL, and VCC).

Address input pads A0 through A11 and pads for control signals such as RAS, CAS, WE and OE are disposed in the above-mentioned areas 9A through 9C in FIG. 6. In addition, pads described below are provided for data input and output, bonding master, monitoring, and monitor pad control:

The bonding master pads include a pad for specifying a static column mode and a pad for specifying a nibble mode and a write-mask capability of x4-bit configuration. The monitoring pads include those for monitoring the internal voltages VCL, VDL, VL, VBB, VCH and VPL. The VPL is monitored to determine at probing whether a VPL adjustment has been made correctly or not.

Of these internal voltages, the VCL is the supply voltage of about 3.3 V to peripheral circuits and is generated by the internal voltage step-down circuit 17. The VDL is the supply voltage of about 3.3 V to the memory array or the sense amplifier 2 and is generated by the internal voltage step-down circuit 7 provided for each of the four memory blocks. The VCH receives the above-mentioned internal voltage VCL to provide a boost supply voltage for selecting a select level of the word line boosted to about 5.3 V, a shared switch MOSFET. The VBB is a substrate back bias voltage of −2 V for example. The VPL is a plate voltage of memory cell, which is set off the midpoint potential between the high and low levels of the bit line in correspondence with the directionality of the leakage current of the dielectric film. The VL is a constant voltage of about 3.3 V to be supplied to the internal step-down circuits 8 and 17.

Based on the above-mentioned X-system select operation, an individual word line is selected in each memory block. That is, in each memory block, one hatched memory mat 1 and its sense amplifier are operated. In correspondence with the word line selection and sense amplifier distributed operation, the internal voltage step-down circuit 8 is provided for each memory block. The memory block division and the corresponding word line selection and sense amplifier activation prevent a large current from concentrating to a particular wiring, thereby suppressing a noise of relatively high level.

Figure 7:
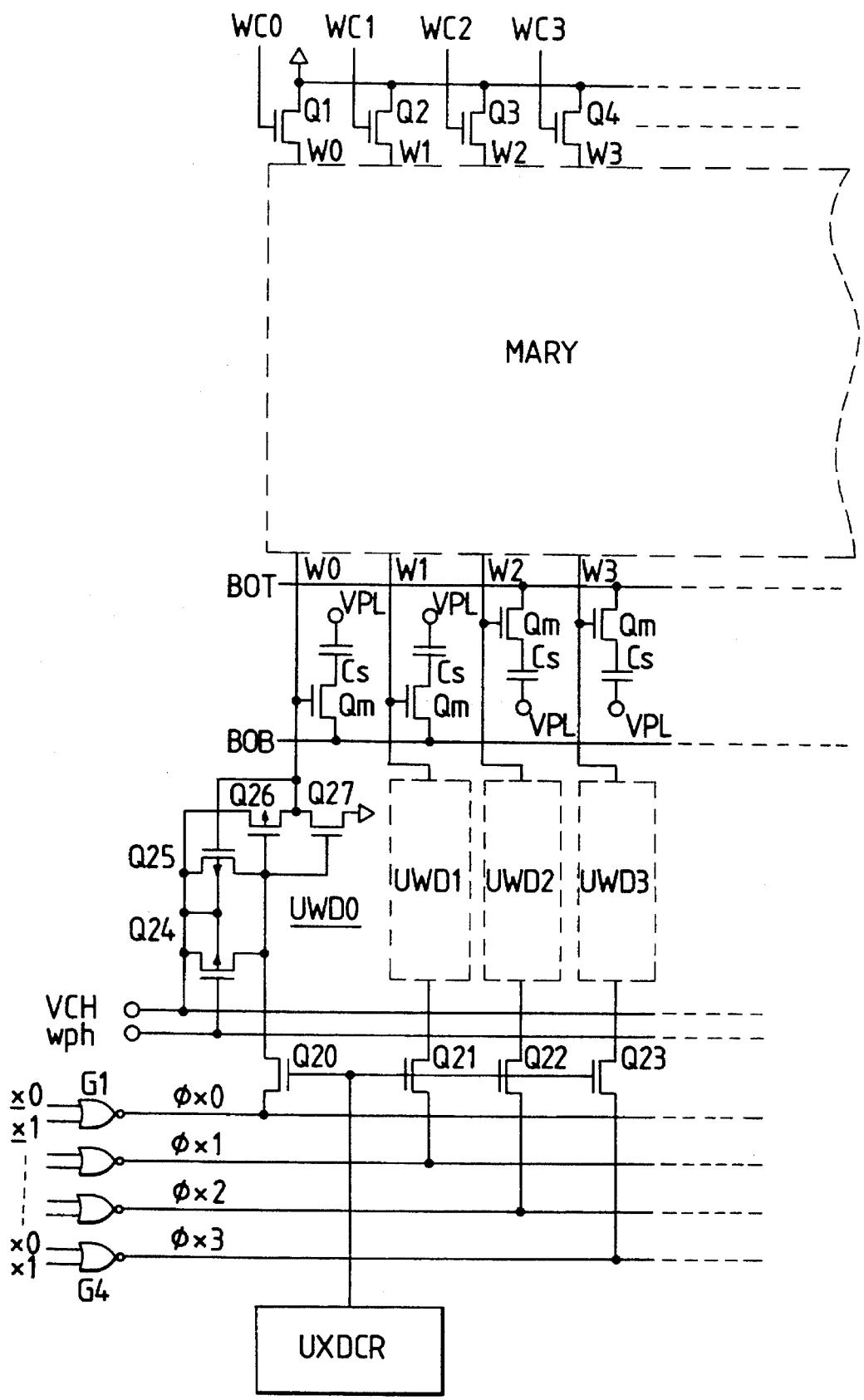
FIG. 7 is a circuit diagram illustrating a memory array portion of the dynamic RAM practiced as a preferred embodiment of the invention.

FIG. 7 shows a circuit diagram of a memory array portion of the dynamic RAM practiced as a preferred embodiment of the invention. In the figure, a representatively illustrated memory array MARY is based on a two-intersection (loop bit line) scheme, but not limited thereto. In the figure, a pair of rows of the memory array is illustrated representatively. Between a pair of complementary bit lines B0T and B0B disposed in parallel, a plurality of memory cells each composed of an address selecting MOSFETQm and an information storage capacitor Cs is connected at the memory cells' input/output nodes in a predetermined regularity.

Although not shown in FIG. 7, the above-mentioned bit lines B0T and B0B are each provided with a switch MOSFET which provides a precharge circuit. The switch MOSFET, when a precharge signal generated in a chip unselected state is supplied to it, is turned on before in the chip unselected state or before the memory cell is put in a selected state. When the switch MOSFET is turned on, the high and low levels of the complementary bit lines B0T and B0B caused by an amplifying operation of the CMOS sense amplifier are shorted to set both the bit lines to a precharge voltage level of about VCL/2 (HVC).

If the chip is put in the unselected state for a relatively long time, but not limited thereto, the above-mentioned precharge level goes down due to a leakage current and the like. The switch MOSFET is provided to supply the half-precharge voltage. A generating circuit for generating this half-precharge voltage, concrete circuit diagram thereof not shown, is adapted to have a capacity of supplying only a relatively small current in order to supplement the above-mentioned leakage current and the like. This suppresses the power dissipation from increasing.

Before the precharge MOSFET is turned on by the RAM's getting in the chip unselected state or the like operation, the above-mentioned sense amplifier is disabled. At this moment, the complementary bit lines B0T and B0B hold the high and low levels in a high impedance state. When the RAM is enabled, the precharge MOSFET is turned off before the sense amplifier is enabled.

Thus, the complementary bit lines B0T and B0B hold the above-mentioned precharge level in the high impedance state. In the half-precharge scheme such as this, the high and low levels of the complementary bit lines B0T and B0B are only shorted, thereby lowering the power dissipation. In the sense amplifier operation, the complementary bit lines B0T and B0B change in a common mode like the high and low levels around the above-mentioned precharge level, thereby reducing a level of a noise caused by the capacitive coupling.

An X (row) address decoder consists of two circuits, but not limited thereto; a first address decoding circuit composed of gate circuits G1 through G4 and a second address decoding circuit such as a unit circuit UXDCR. FIG. 7 shows the unit circuit UXDCR and the NOR gate circuits G1 through G4. In the figure, circuit symbols for the gate circuits G2 and G3 are omitted.

The above-mentioned unit circuit UXDCR generates a decode signal for four word lines. The four gate circuits G1 through G4 constituting the first decoding circuit generate four word line select timing signals φx0 through φx3 based on combinations of word select signals x0 and x1 corresponding to a low-order two-bit address signal. These word line select signals φx0 through φx3 are put in word line drivers UWD0 through UWD3 via the above-mentioned transmission gates MOSFET Q20 through Q23.

For a word line driver WD, the unit circuit UWD0 is illustrated representatively. As seen from the figure, the word line driver WD is composed of a CMOS driver having a p-channel MOSFET Q26 and an n-channel MOSFET Q27, and a p-channel MOSFET Q24 and Q25 provided between an input of the CMOS driver and an operating voltage terminal VCH. A gate of the p-channel MOSFET Q24 is supplied with a precharge signal wph level-converted by such a level converter as mentioned above. A gate of the p-channel MOSFET Q25 is supplied with a drive output of the word line W0.

That is, when the word line select timing signal −x0 formed according to the internal step-down voltage VCL is turned high to set the word line W0 to an unselected level such as a ground potential, the MOSFET Q25 pulls up an input level of the CMOS circuit, upon timing signal's going low, to securely turns off the p-channel MOSFET Q26. This prevents a direct current from being consumed between the p-channel MOSFET Q26 and Q27 that constitute the CMOS driving circuit corresponding to the unselected word line.

By dividing the X address decoder into the two parts as mentioned above, a spatial interval of the unit circuit UXDCR constituting the second X address decoder can be matched with that of the word line, thereby eliminating a wasted space on the semiconductor substrate. Between a far end of the word line and a ground potential of the circuit, switch MOSFET Q1 through Q4 and so on are provided. Gates of these switch MOSFET Q1 through Q4 are respectively supplied with signals WC0 through WC3 which are opposite in phase to selection signals to be supplied to corresponding word lines W0 through W3. This turns off only the switch MOSFET corresponding to the selected word line and turns on the other switch MOSFETs. This, in turn, prevents any unselected word line from being undesirably pulled up to the midpoint potential by the capacitive coupling caused by rising of the selected word line.

Figure 8:
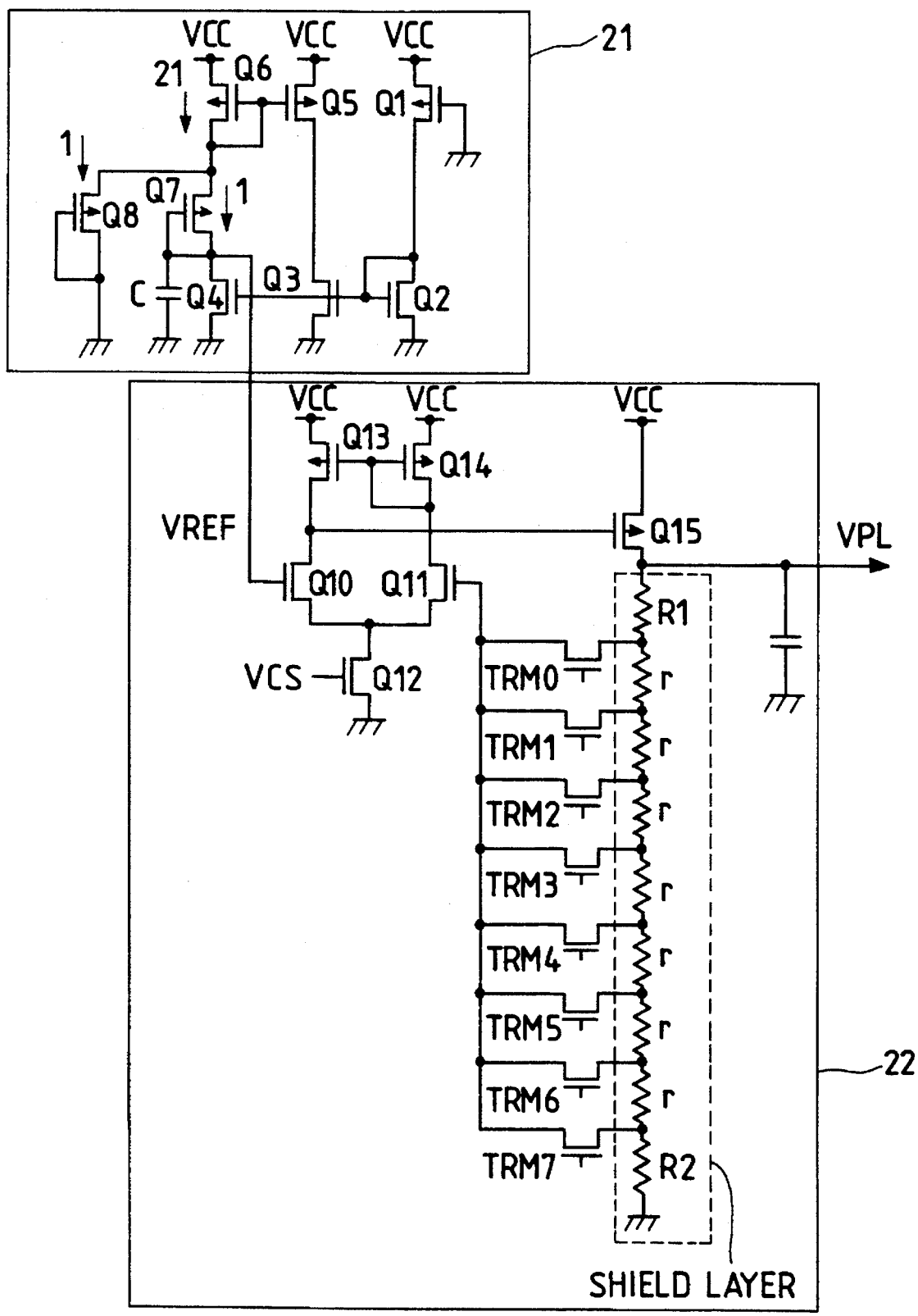
FIG. 8 is a circuit diagram illustrating a reference voltage generating circuit constituting a plate voltage VPL and practiced as a preferred embodiment of the invention.

FIG. 8 shows circuit diagrams of the plate voltage output circuit 22 for generating the plate voltage VPL and the reference voltage generating circuit 21 practiced as a preferred embodiment of the invention. To prevent the illustration of the circuit diagrams from being complicated, some of circuit symbols assigned to circuit elements of FIG. 8 are common with those used in FIG. 7; however, the common symbols represent different circuit functions between the figures.

A ground potential is applied to a gate of a p-channel MOSFET Q1 to form a constant current. The constant current is adapted to flow to a diode-type n-channel MOSFET Q2. The MOSFET Q2 has n-channel MOSFETs Q3 and Q4 disposed in a current mirror manner. A drain constant current of the MOSFET Q3 is converted into a source constant current by a current mirror circuit consisting of p-channel MOSFETs Q5 and Q6. At this time, based on size setting of the MOSFETs Q3 and Q4 or MOSFETs Q5 and Q6, the source constant current is set to 2i and a sink constant current of the MOSFET Q4 is set to i.

Between the above-mentioned MOSFET Q4 and the p-channel MOSFET Q6, a diode-type p-channel MOSFET Q7 is connected in series. Between a connection point of the above-mentioned MOSFETs Q6 and Q7 and the ground potential point of the circuit, a diode-type p-channel MOSFET Q8 is provided. This setup allows the same constant current i to flow to the two diode-type p-channel MOSFETs Q7 and Q8.

A channel region of the MOSFET Q8 is ion-implanted with p-type impurities to raise its threshold voltage in correspondence with an impurity introduction amount. Since the same constant current i is made flow to the MOSFETs Q7 and Q8 with a difference between the threshold values of the Q7 and the Q8 being kept as it is, a reference voltage VREF is generated from a source of the Q7, the reference voltage VREF corresponding to the difference voltage Vth8−Vth7 between the threshold voltages Vth8 and Vth7 of the Q8 and Q7. The difference voltage Vth8−Vth7 can be correctly set to about 1.1 V by means of conventional ion-implanting technology.

The reference voltage VREF thus obtained is converted (or adjusted) into a plate voltage VPL by a DC amplifier that follows. A load circuit composed of p-channel MOSFETs Q13 and Q14 arranged in a current mirror manner, n-channel MOSFETs Q10 and Q11 arranged in a differential manner, and a constant current MOSFET Q12 for generating an operating current for these MOSFETs constitute a differential amplifier. The differential amplifier is provided with an output p-channel MOSFET Q15.

An output signal of the above-mentioned MOSFET Q15 is divided by feedback resistors R1 and R2 to be negatively fed back to the differential amplifier. At that time, to set a plate voltage optimum for the memory cell, trimming registers r for fine adjustment are provided in series between the feedback resistors R1 and R2. Trimming switch MOSFETs TRM0 through TRM7 are provided between a feedback input of the differential amplifier and connections between the trimming registers r with the R1 and the R2 inclusive. Gates of these switch MOSFETs TRM0 through TRM7 are fixedly set by hardware such as fusing, but not limited thereto, for switching control.

For example, if, when the middle switch TRM3 is turned on, a constant voltage VPL at that moment is higher than a target plate voltage, the TRM2 over it is turned on to raise a feedback voltage and decrease a gain, thereby lowering the plate voltage VPL. Likewise, turning on the TRM1 and TRM0 can decrease the plate voltage VPL accordingly.

Conversely, if, when the middle switch TRM3 is turned on, a plate voltage obtained at that moment is lower than a target optimum plate voltage, the TRM4 below it is turned on to lower the feedback voltage and increase the gain, thereby raising the plate voltage VPL. Likewise, turning on the TRM5 through TRM7 can raise the plate voltage VPL accordingly.

To save the power to the RAM, a combined resistance of the series circuit composed of the R1, r, and R2 is set to a relatively high level. That is, the combined resistance is set to a level large enough for reducing the DC current that flows through the series circuit. Consequently, the effect of coupling gets larger.

The above-mentioned reference voltage generating circuit 21 has a constitution, but not limited thereto, that supplies the reference voltage VREF to the plurality of plate voltage output circuits provided for the memory mats of FIG. 6. Therefore, the reference voltage generating circuit 21 is disposed in the chip center along with the plate voltage output circuits. The chip center is a location where vertically and horizontally running signal lines concentrate. On the other hand, the series resistance circuit composed of the R1, r, and R2 for providing the above-mentioned large resistance occupies a relatively large area in the plate voltage output circuit 22. It is therefore required to provide a wiring channel on the series resistance circuit. However, such a setup causes the plate voltage VPL to fluctuate because of the effect of coupling.

To solve this problem, in this embodiment, the series resistance circuit is provided with a shield layer as indicated with dashed lines in FIG. 8. The shield layer allows the wiring channel along which signal lines run to be disposed on the above-mentioned high-resistance elements.

Figure 9:
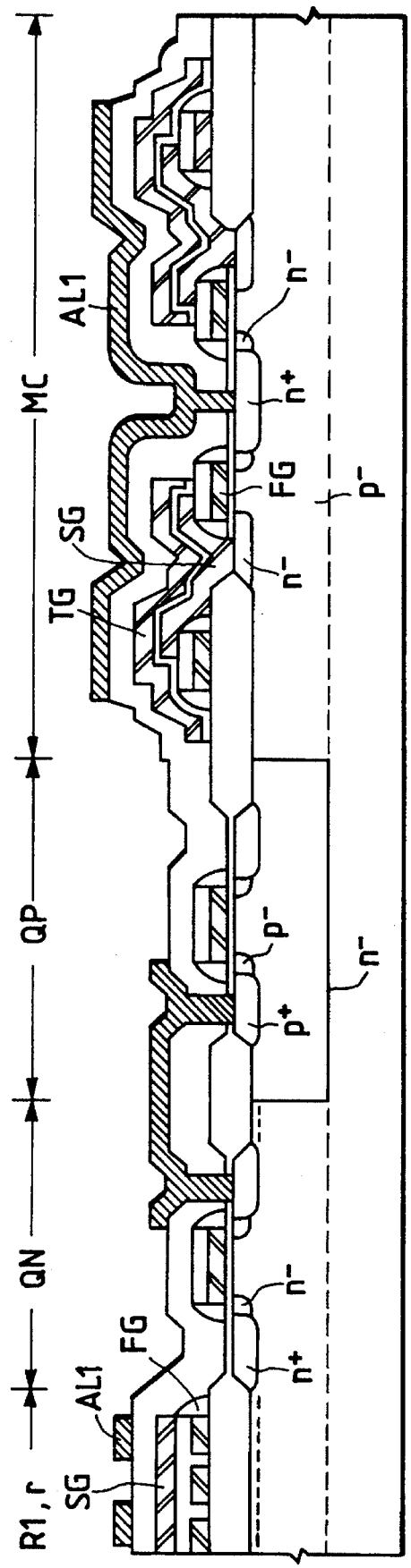
FIG. 9 is a sectional view illustrating a main element of the RAM containing a resistor element and practiced as a preferred embodiment of the invention.

FIG. 9 shows a sectional view of a main element structure of the RAM containing the above-mentioned resistance elements, the RAM being practiced as a preferred embodiment of the invention. In the figure, an n-channel MOSFET indicated by QN, a p-channel MOSFET indicated by QP, and a memory cell indicated by MC are provided to the right of the above-mentioned resistors R1 and r.

With the memory cell MC, a gate of an address selecting MOSFET is composed of a first-layer polysilicon FG and both poles of an information storage capacitor are composed of a second-layer polysilicon SG and a third-layer polysilicon TG respectively, thus providing a so-called STC structure. On the second-layer polysilicon SG serving as a storage node, a silicon oxide film or a silicon nitride film, not shown, is disposed as a relaxation film on which a highly dielectric film is formed. On the highly dielectric film, the third-layer polysilicon TG constituting a plate pole is formed.

In this embodiment, the resistors including the R1 and the r are formed by the first-layer polysilicon FG formed on a field insulating film, on which the shield layer is formed using the second-layer polysilicon SG via an inter-layer insulating film, but not limited thereto. The shield layer is given an alternating ground potential such as the circuit ground potential or the supply voltage VCL, but not limited thereto. Over the shield layer, a signal line made of aluminum AL1 or the like via an inter-layer insulating film.

With a RAM using two aluminum layers, a first-layer aluminum may provide a vertically extending wiring channel and a second-layer aluminum, a horizontally extending wiring channel, for example. For the shield layer, the third-layer polysilicon may be used or when only the second-layer aluminum is used for the wiring layer, the first-layer aluminum may be used as the shield layer.

Figure 10:
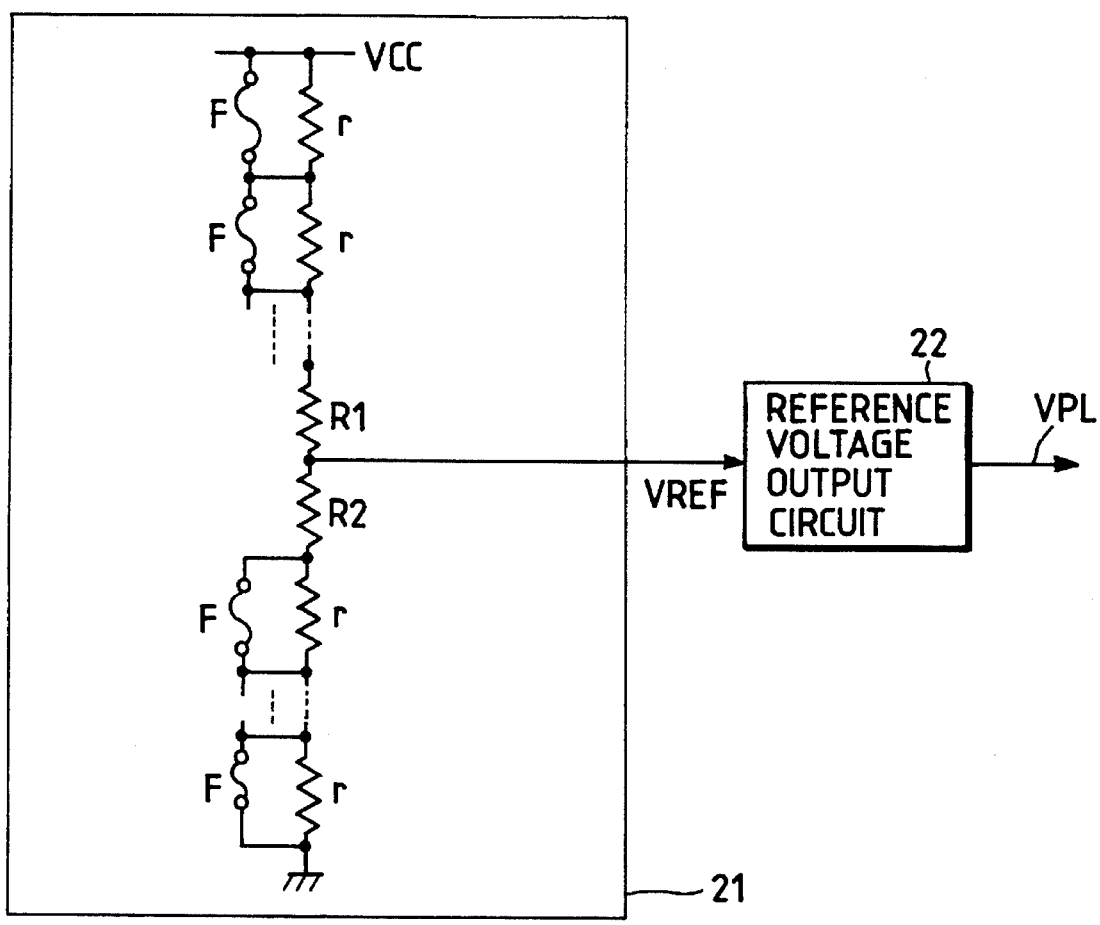
FIG. 10 is a circuit diagram illustrating the reference voltage generating circuit of FIG. 8 practiced as another preferred embodiment of the invention.

FIG. 10 shows a circuit diagram illustrating the reference voltage generating circuit corresponding to the plate voltage, the generating circuit being practiced as another preferred embodiment of the invention. In this embodiment, a supply voltage VCC is divided by a series resistance circuit to generate a reference voltage VREF which corresponds to a plate voltage VPL. Resistors R1 and R2 have relatively large resistance values to from the plate voltage having an approximate value.

Adjustment resisters r connected in series have relatively small values. The adjustment resistors r are connected with fuses F in parallel one by one to be shorted. That is, none of the fuses are fused, the supply voltage VCC is divided by a ratio between R1 and R2 to generate the reference voltage VREF corresponding to the plate voltage VPL.

The above-mentioned supply voltage VCC may be an externally supplied supply voltage as in the case of the embodiment of FIG. 6; however, it is desired that the VCC be a supply voltage that corresponds to the high level VH of the bit line, or a voltage corresponding to the stepped-down internal voltage VCL.

In the above-mentioned probing process, if the divided voltage formed by the above-mentioned resistors R1 and R2 is found lower than a desired level by the measurement of leakage current and voltage by the monitoring capacitor, a fuse of an adjusting resistor r provided for the resistor R2 in parallel thereto is fused. To be specific, a fine wire made of aluminum or the like is fused by laser radiation for example. This increases a lower-side resistance value such as R2 +r to raise the divided voltage VREF. Likewise, fuses of the adjusting resistors r are sequentially fused until the desired plate voltage VPL is obtained.

Conversely, in the above-mentioned probing process, if the divided voltage is found higher than a desired level, a fuse of an adjusting resistor r provided for the resistor R1 in parallel thereto is fused in the manner mentioned above. This increases a upper-side resistance value such as R1 +r to lower the divided voltage VREF. Likewise, fuses of the adjusting resistors are sequentially fused until the desired plate voltage is obtained. The fusing is performed while monitoring the plate voltage VPL.

Referring to FIG. 8, the reference voltage generating circuit 21 generates the predetermined reference voltage VREF. Based on the reference voltage VREF, the plate voltage output circuit 22 sets and outputs the optimum plate voltage VPL in a variable manner. In FIG. 10, however, the reference voltage generating circuit 21 sets and generates the reference voltage VREF in a variable manner and the plate voltage output circuit 22 generates and outputs the plate voltage VPL that corresponds to the supplied reference voltage VREF one to one. It should be noted that the reference voltage VREF outputted from the reference voltage generating circuit 21 is set to a level corresponding to the optimum plate voltage VPL.

In the above description, the reference voltage generating circuit 21 is disposed in the chip center along with the plate voltage output circuit 22. However, the circuit layout is not limited to one mentioned above. For example, the single reference voltage generating circuit 21 may be provided on one semiconductor chip to supply the reference voltage VREF to a plurality of plate voltage output circuits 22 provided for a plurality of memory mats on the same chip. The plate voltage output circuit 22 may be composed of an arithmetic amplifier made up of circuits similar to the differential amplifier and output circuit of FIG. 8 in a voltage follower manner, but not limited thereto.

Figure 11:
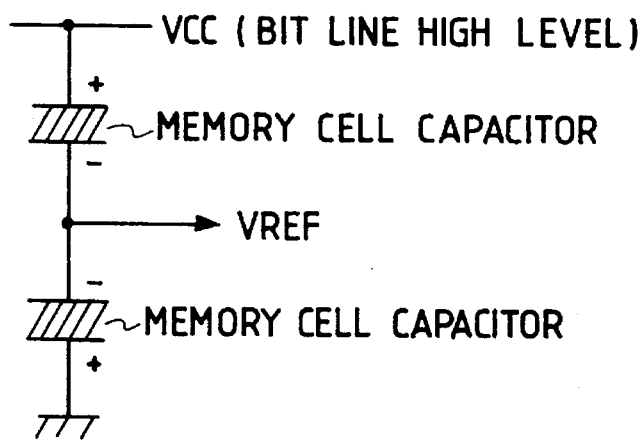
FIG. 11 is a circuit diagram illustrating the reference voltage generating circuit of FIG. 8 practiced still another preferred embodiment of the invention.

FIG. 11 shows the reference voltage generating circuit 21 corresponding to the plate voltage VPL, the generating circuit practiced as still another preferred embodiment of the invention. In this embodiment, a memory cell capacitor is regarded as a resistor to obtained the reference voltage VREF. That is, like the case of FIG. 2(A), with the bit line side being the positive (+) pole and the plate side being the negative (−) pole, a voltage is applied to a capacitor on the power supply side in positive direction and to a capacitor on circuit ground side in negative direction.

In each of the series capacitors mentioned above, a same current flows. Therefore, a voltage corresponding to leakage current characteristics on the positive and negative sides appears to provide, without change, the reference voltage VREF that corresponds to the plate voltage. This setup eliminates the necessity for the above-mentioned monitoring capacity. That is, forming the reference voltage generator practiced as this embodiment on a chip constituting a dynamic RAM can automatically and optimally sets the plate voltage VPL in correspondence with the capacitor leakage current of memory cell.

The reference voltage VREF is supplied to the plate via the above-mentioned arithmetic amplifier of voltage follower type. In this setup, a dummy cell is provided for each memory mat. Capacitors for the dummy cell are connected in series as shown in FIG. 11 to form the reference voltage VREF for each memory mat.

If a capacitor same as the memory cell is used for the above-mentioned capacitor for forming the reference voltage VREF, the leakage current is very small and therefore it may take a long time before a stable voltage is reached. To overcome this problem, by using dummy memory cells connected to memory cells corresponding to memory array word lines, about 1,000 capacitors may be connected in parallel to flow a leakage current about 1,000 times as high as that of one memory cell. In this case, an average of the leakage currents for the 1,000 memory cells can be obtained to provide the stable plate voltage VPL. That is, a process fluctuation of the dummy cells used for the reference voltage generating circuit will not affect the plate voltage.

Figure 12:
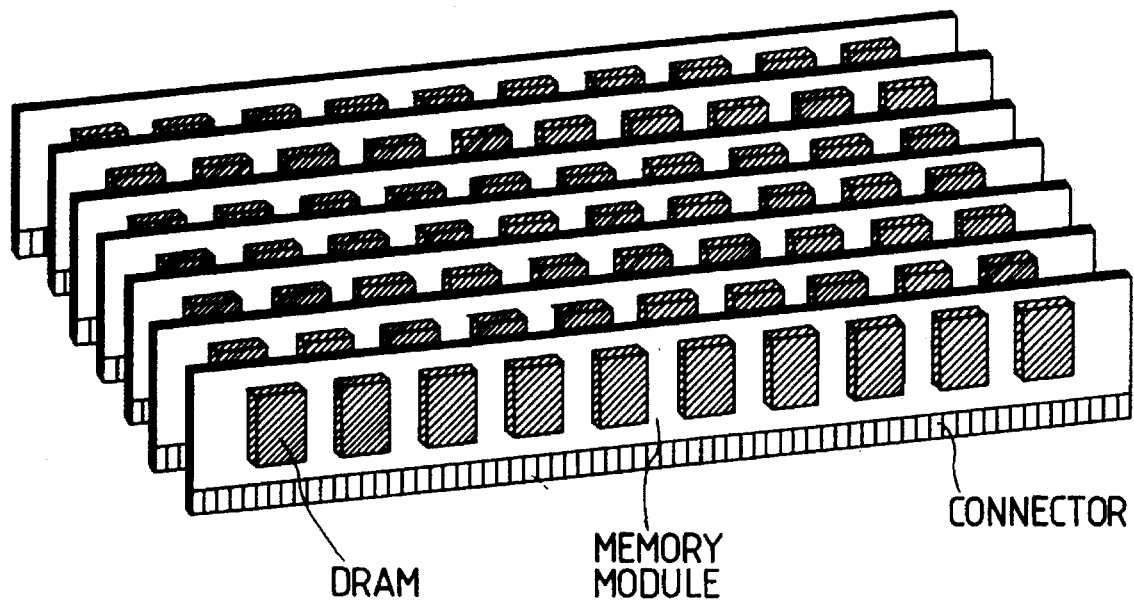
FIG. 12 is a view illustrating a main portion of a memory board to which the dynamic RAM according to the invention is applied.

FIG. 12 is an outline view of a main portion of a computer system memory board using the DRAM of this invention.

The memory board has a plurality of memory modules. On each of the memory modules, a plurality of dynamic RAMs of this invention is mounted in a package-sealed manner with the dynamic RAMs connected to wirings on the memory modules.

Via a connector on the memory modules, the DRAMs of this invention are connected to an address bus or a data bus in the computer system. Actually, the connection is made by plugging the above-mentioned connector in a slot for the memory board in the memory portion of the memory of a memory accommodating section in the computer system. Thus, the number of DRAMs of this invention that can be mounted on the memory board, or the memory module, determines an information storage capacity of a storage unit of the computer system.

Figure 13:
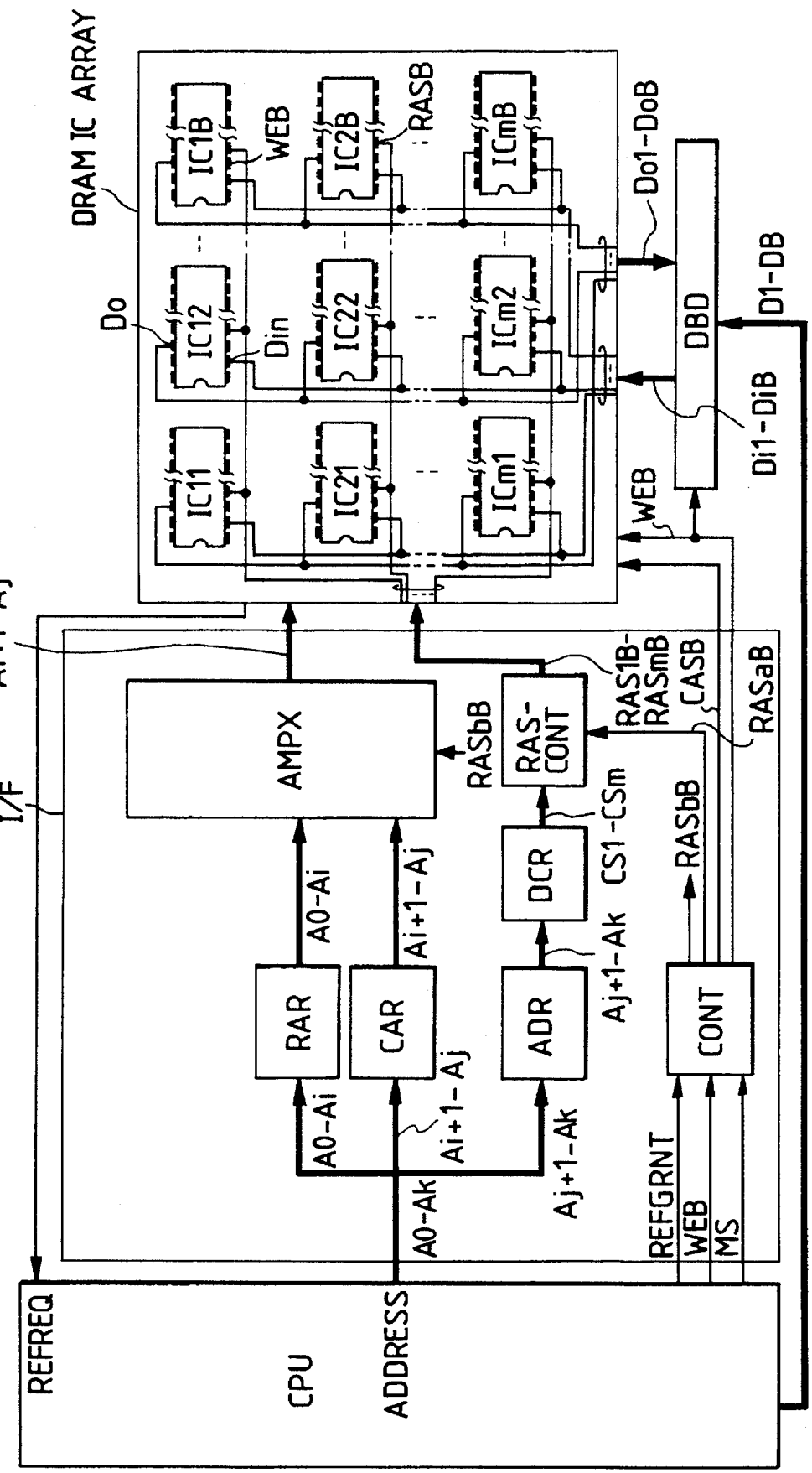
FIG. 13 is a schematic diagram illustrating a main portion of a dynamic RAM system to which the dynamic RAM according to the invention is applied.

FIG. 13 shows a schematic diagram of a DRAM system using the DRAM of this invention. The system is composed of a central processing unit (CPU), a DRAM IC array, and an interface circuit (I/F) for interfacing between the CPU and the DRAM IC array for example. The DRAM IC array is composed of mounted DRAMs of this invention.

Input/output signal to be transferred between the DRAM system and the CPU will be described below. Address signals A0 through Ak formed by the CPU select an address of the DRAM of this invention. A refresh instructing signal REFGRNT is a control signal for refreshing memory information stored in the DRAM of this invention. A write enable signal WEB is a control signal for reading/writing data on the DRAM of this invention. A memory start signal MS is a control signal for starting a memory operation of the DRAM of this invention. Input/output data D1 through DB in the data bus are transferred between the CPU and the DRAM. A refresh request signal RFREQ is a control signal for requesting to refresh the memory information stored in the DRAM of this invention.

In the above-mentioned interface circuit I/F, a row address receiver RAR receives address signals A0 through Ai from among address signals A0 through Ak sent from the CPU to convert the received address signals into address signals having a timing suited to the operation of the DRAM of this invention. A column address receiver CAR receives address signals Ai+1 through Aj from among the above-mentioned address signals A0 through Ak. The CAR converts the received address signals into address signals having a timing suited to the operation of the DRAM of this invention. An address receiver ADR receives address signals Aj+1 through Ak from among the address signals A0 through Ak and converts the received address signals into address signals having a timing suited to the operation of the DRAM of this invention.

A decoder DCR sends chip select control signals (CS1 through CSm) for selecting a chip of the DRAM of this invention. A RAS control circuit RAS-CONT sends a chip select signal and a row address capture signal having a timing suited to the DRAM of this invention. An address multiplexer ADMPX multiplexes the above-mentioned address signals A0 through Ai and Ai+1 through Aj in a time series manner to send a resultant signals to the DRAM of this invention. In a data bus driver DBD, the input/output of data between the CPU and the DRAM of this invention is switched by the above-mentioned WEB signal. A controller CONT sends signals for controlling the address multiplexer ADMPX, the RAS controller RAS-CONT, the data bus driver DRB, and the DRAM of this invention.

In the above-mentioned DRAM system, the address signals operate as follows. The address signals A0 through Ak to be sent from the CPU are functionally divided in the DRAM system into two groups, the address signals A0 through Aj and the address signals Aj+1 through Ak. The address signals A0 through Aj are used for row and column addresses of a memory matrix on each DRAM chip of this invention. The address signals A0 through Ai are assigned to row selection of the IC chip array of the DRAM of this invention, while the address signals Ai+1 through Aj are assigned to column selection of the IC chip array.

Circuit operations in the DRAM system are as follows. First, the address signals A0 through Ai and Ai+1 through Aj are applied to the address multiplexer ADMPX via the row address receiver RAR and the column address receiver CAR respectively. Then, in the address multiplexer ADMPX, when a RASbB signal is set to a certain level, the row address signals A0 through Ai are sent out to be applied to an address terminal of the DRAM of this invention. At this moment, the column address signals Ai+1 through Aj are prevented from getting out of the address multiplexer.

Then, when the RASbB signal is set the opposite level, the column address signals Ai+1 through Aj are sent from the address multiplexer to be applied to the above-mentioned address terminal. At this moment, the row address signals A0 through Ai are prevented from being getting out of the address multiplexer.

Thus, depending on the level of the RASbB signal, the address signals A0 through Ai and Ai+1 through Aj are applied to the address terminal of the DRAM of this invention in a time series manner. The chip select signals Aj+1 through Ak mainly select a chip in the DRAM of this invention through the decoder DCR. These signals are converted to the chip select signals CS1 through CSm to be used for chip select and row address capture signals.

Address setting in a chip on each row of the DRAM of this invention is performed as follows. The row address signals A0 through Ai are applied to address terminals of all IC chips of the DRAM of this invention. Then, when one of RAS1B through RASmB signals, for example the RAS1B signal, is set to a certain level, it is assumed that B ICs on an uppermost level are selected. At this time, the above-mentioned row address signals A0 through Ai are applied to row addresses of memory matrix arrays in the above-mentioned ICs (IC11, IC12, . . . IC1B) before the RAS1B signal. This is because, if the RAS1B signal is applied before the row address signals A0 through Ai, it is possible that a signal other than the row address signals is captured.

Then, the column address signals Ai+1 through Aj are applied to address terminals of all IC chips of the DRAM of this invention. When the CASB signal delayed from the RAS1B signal is set to a certain level, the above-mentioned column address signals Ai+1 through Aj are captured in column addresses of memory matrix arrays in B IC chips on the uppermost level nM. Here, again, the column address signals Ai+1 through Aj are applied to the above-mentioned ICs before the CASB signal. The CASB signal indicates which of the signal groups is to be sent; the row address signals A0 through Ai or the column address signals Ai+1 through Aj.

By the above-mentioned operations, the addresses in the B chips on the uppermost level nM of the DRAM of this invention are set. The ICs on levels other than the uppermost level of the DRAM of this invention are not selected because the RAS2B through RASm signals are opposite to the RAS1B signal in level.

At the addresses set above, data is read and written as follows. A data read/write operation is determined by the high level or low level of the above-mentioned WEB signal. A data write operation is performed by applying data DI1 through DIB from the CPU to the above-mentioned specified addresses while the WEB signal is at a certain level.

A data read operation is performed by outputting, in B bits, data Do1 through DoB from the above-mentioned addresses at which the write operation has been completed, while the WEB signal is at the opposite level. The controller CONT receives the REFGRNT signal, the WEB signal, and the MS signal from the CPU and sends the CASB signal, the RASaB signal, the RASbB signal, and the WEB signal. These control signals sent from the controller operate as follows. The CASB signal determines which of the signal groups is sent to the chips of the DRAM of this invention; the row address signals A0 through Ai or the column address signals Ai+1 through Aj. The CASB signal also captures IC chip column address signals.

The RASaB signal supplies the CS1 through CSm signals to the IC chip arrays in the DRAM of this invention in a same timing. The WEB signal determines the data read/write operation on memory cells in the IC chips in the DRAM of this invention. The RASbB signal is a switching timing signal for converting the row address signals A0 through Ai and the column address signals Ai+1 through Aj coming from the address multiplexer ADMPX into time-series multiplexed signals. The switching timing between the row address signals A0 through Ai and the column address signals Ai+1 through Aj is provided by delaying the RASaB signal so that, when one of the RASB (RASB1 through RASBm) signals is selected, the row address signals A0 through Ai are outputted from the address multiplexer ADMPX.

A relationship between the WEB signal and the data bus driver DBD is as follows. The WEB signal sent from the controller CONT is applied to the DRAM of this invention and the data bus driver DBD. For example, when the WEB signal is high, the DRAM is in the read mode in which data is outputted from the DRAM to the CPU via the data bus driver DBD. At this moment, the WEB signal prevents input data from being written from the DBD to the DRAM of this invention. When the WEB signal is low, the DRAM is in the write mode in which data is sent to the DRAM at its data input terminal from the CPU via the data bus driver DBD. The data received at the input terminal is written to specified addresses. At this moment, the WEB signal prevents the data stored in the DRAM from being outputted via the data bus driver DBD.

Figure 14:
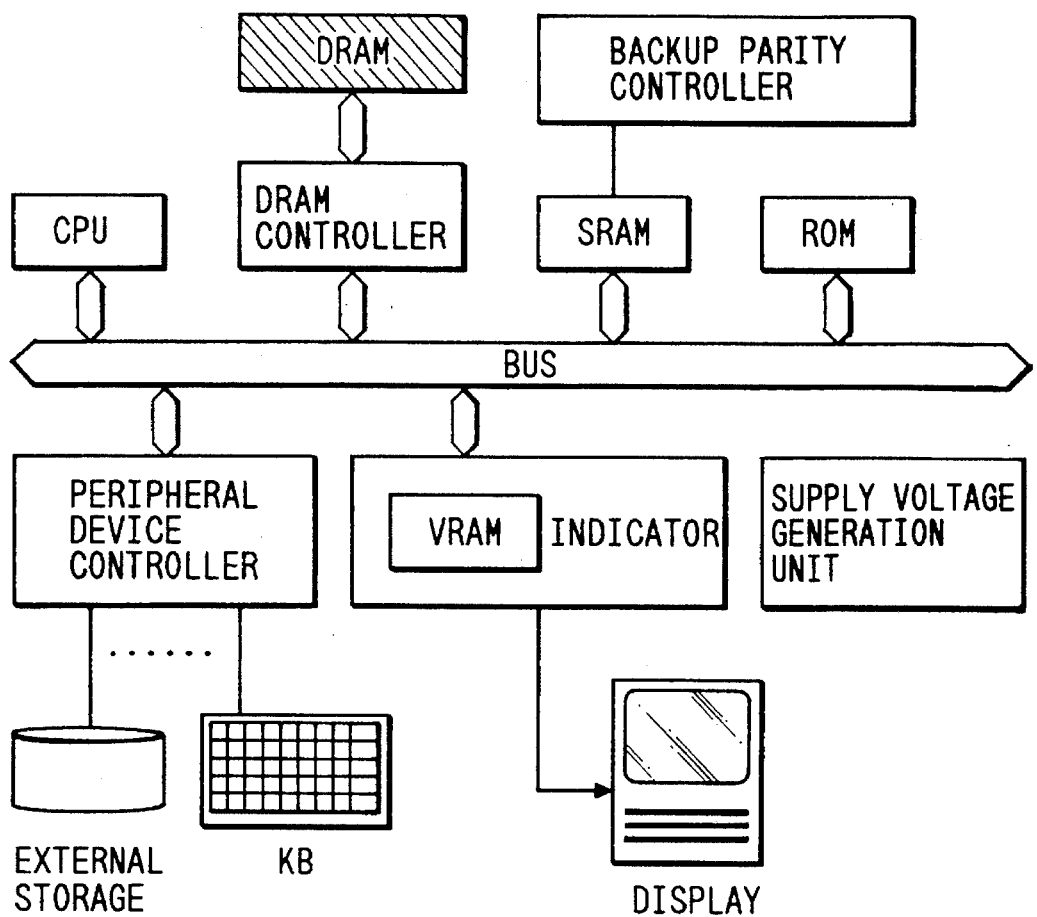
FIG. 14 is a schematic diagram illustrating a main portion of a computer system to which the dynamic RAM according to the invention is applied.

FIG. 14 shows a schematic diagram of a main portion of a computer system having the DRAM according to this invention. This computer system comprises a bus, a CPU, a peripheral device controller, the DRAM according to this invention as a main storage and a DRAM controller, an SRAM as a backup memory and an SRAM controller, a ROM storing a program, and a display.

The above-mentioned peripheral device controller is connected to an external storage and a keyboard KB. A display system comprises a video RAM (VRAM) and is connected to the display, which is an output device, to display information stored in the VRAM. The computer system contains a supply voltage generating circuit for supplying a power to circuits internal to the computer system. The CPU generates memory control signals to control operation timings of the above-mentioned memory devices. Although this invention is applied to the DRAM as the main storage, it is also possible, if the VRAM is a multi-port VRAM, to apply this invention to a random access portion of the VRAM.

Figure 15:
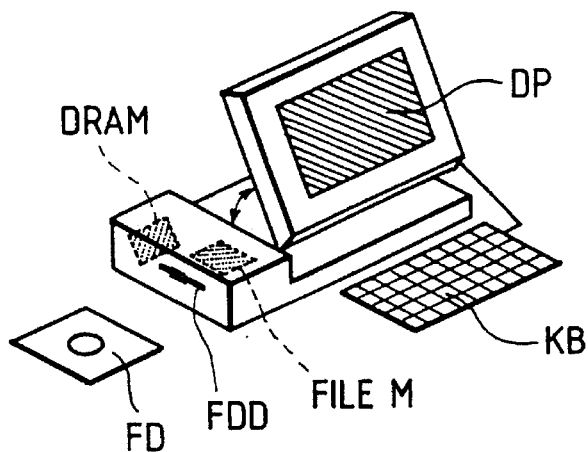
FIG. 15 is a view functionally illustrating a personal computer system to which the dynamic RAM according to the invention is applied.

FIG. 15 is a view of a main portion of a personal computer system to which the DRAM of this invention has been applied as its main storage. This computer system contains a floppy disk drive FDD, a file memory M based on the DRAM of this invention as a main storage, and an SRAM as a battery backup by way of example. This computer system also has a keyboard KB and a display DP as input and output devices by way of example. A floppy disk is inserted in a floppy disk drive in the system. This setup constitutes a desktop personal computer that store information in the floppy disk FD as software and in the file memory M as hardware. Although, in this embodiment, the invention has been applied to the desktop personal computer, it is applicable to a laptop personal computer as well. It is apparent that the invention is not limited to use of the floppy disk.

Figure 16:
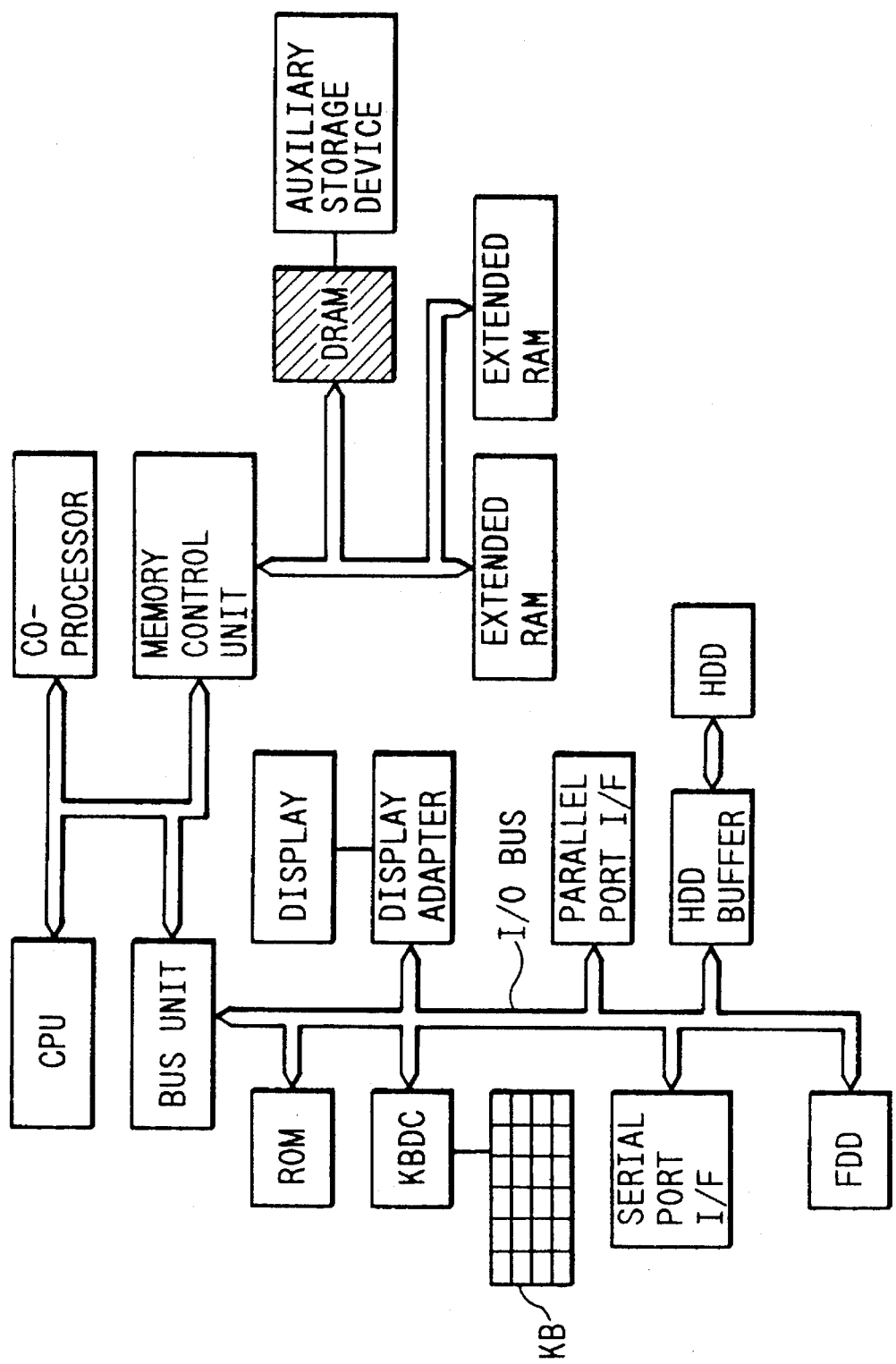
FIG. 16 is a functional block diagram illustrating the personal computer system of FIG. 15.

FIG. 16 shows a functional block diagram of a personal computer system to which the DRAM according to this invention has been applied as its main storage. This personal computer comprises a CPU, an I/O bus, a bus unit, a memory control unit for accessing high-speed memories such as a main storage and extended memories, the DRAM according to the invention as the main storage, a ROM storing a basic control program, and a keyboard controller KBDC connected to a keyboard.

A display adaptor is connected to the I/O bus and a display. The I/O bus is connected to a parallel port I/F, a serial port I/F for connecting a mouse for example, a floppy disk drive FDD, and a buffer controller HDD buffer for hard disk interfacing.

The memory control unit is connected the extended RAMs and the DRAM of this invention via a bus. The personal computer system operates as follows. When the system is powered on to be activated, the CPU accesses the ROM via the I/O bus to perform initial diagnosis and setting. Then, the CPU loads a system program from an auxiliary storage device to the DRAM of this invention serving as the main storage.

The CPU causes the HDD controller via the I/O bus to access the hard disk HDD. When the system program has been loaded, the CPU performs processing according to a request by user. The user carries out a task by performing a data input/output operation through the keyboard controller and the display adaptor connected to the I/O bus. As required, the user uses input/output deices connected to the parallel port interface and the serial port interface. If the main storage implemented by the DRAM of this invention runs short in capacity, the extended RAM supplements the the main storage. The hard disk in the figure may be replaced with a flash file based on flash memory.

As in the above-mentioned embodiment, mounting the dynamic RAM according to the invention on an information processing system will reduce system dimensions while enhancing system performance due to the increased integration, storage capacity, processing speed, and energy saving provided by the novel dynamic RAM.

While preferred embodiments of the invention have been described using specific terms, such description is for illustrative purposes only, and it is to be understood that changes and variations may be made without departing from the spirit or scope of the appended claims. With the layout of the entire DRAM basically kept as shown in FIG. 6, an arrangement of circuits around the DRAM may take various embodiments. For example, the plate voltage may be introduced via an external terminal. Also, a signal may be formed so that the switch MOSFET of FIG. 8 is turned on/off by wire bonding instead of fusing. As mentioned above, the invention has been applied to the case of a large-scale DRAM, a technological area from which this invention has been derived; however, this invention is not limited thereto. This invention is also applicable to a DRAM which is incorporated in large-scale logic integrated circuits such as a one-chip microcomputer and a custom LSI.

Of the inventions disclosed in this application, a representative one will be outlined as follows. On the dynamic memory device, a voltage is applied as its plate voltage, which makes generally equal a leakage current of an information storage capacitor contained in the device produced when a potential of a bit line is positive relative to the plate voltage and a leak current produced when the potential is negative. Further, in setting the plate voltage, a plate voltage generating circuit is provided with an output voltage adjusting capability to measure, in a wafer probing process, a monitoring capacitor formed on a semiconductor wafer on which the information storage capacitor is also formed, the monitoring capacitor being manufactured by a same process and from a same material as those of the information storage capacitor. According to a measurement result, the plate voltage is set to an optimum value by the output adjusting capability, which is meant for varying a plate voltage level. In addition, the information processing system is constituted based on a dynamic memory device having the plate voltage set to the above-mentioned level. According to the above-mentioned constitution, a substantial leakage current is reduced, thereby reducing the size of the information storage capacitor or, conversely, increasing a substantial storage capacity in unit area. This in turn enhances integration and storage capacity of the dynamic memory device. Additionally, the dynamic memory device reduced in size and increased in storage capacity reduces the size and enhances the performance of the information processing system containing the dynamic memory device.

What is claimed is:

1. A dynamic memory device formed on one semiconductor substrate, comprising:
   a memory cell having a metal-oxide semiconductor field-effect transistor having:
      a source-drain path having two ends with one end connected to a bit line and a gate connected to a word line; and
      a capacitor having a first pole connected to the other end of said source-drain path and a second pole through which a plate voltage is supplied, said bit line being supplied with one of a first voltage and a second voltage lower than said first voltage when a predetermined charge is set to said capacitor; and
   plate voltage setting means for setting a value of said plate voltage,
   wherein said plate voltage is such that a leakage current of a charge stored in said capacitor when said bit line is supplied with said first voltage is made substantially equal to a leakage current of a charge stored in said capacitor when said bit line is supplied with said second voltage;
   wherein said dynamic random memory device is formed, in a manufacturing process thereof, on one semiconductor wafer, said semiconductor wafer including a monitoring capacitor formed by a manufacturing method by which said capacitor is manufactured and made of a material of which said capacitor is made, and wherein said plate voltage is set according to a result of measuring a leakage current of said monitoring capacitor.

2. A dynamic memory device formed on one semiconductor substrate, comprising:
a memory cell having a metal-oxide semiconductor field-effect transistor having:
a source-drain path having two ends with one end connected to a bit line and a gate connected to a word line; and
a capacitor having a first pole connected to the other end of said source-drain path and a second pole through which a plate voltage is supplied, said bit line being supplied with one of a first voltage and a second voltage lower than said first voltage when a predetermined charge is set to said capacitor; and
plate voltage setting means for setting a value of said plate voltage,
wherein said plate voltage is such that a leakage current of a charge stored in said capacitor when said bit line is supplied with said first voltage is made substantially equal to a leakage current of a charge stored in said capacitor when said bit line is supplied with said second voltage;
comprising a reference voltage generating circuit for generating a reference voltage from a predetermined supply voltage and a plate voltage output circuit having said plate voltage setting means, said plate voltage output circuit generating said plate voltage from said reference voltage, wherein said plate voltage setting means contains fuse means fixable in a hardware approach.

3. A dynamic memory device formed on one semiconductor substrate, comprising:
a memory cell having a metal-oxide semiconductor field-effect transistor having:
a source-drain path having two ends with one end connected to a bit line and a gate connected to a word line; and
a capacitor having a first pole connected to the other end of said source-drain path and a second pole through which a plate voltage is supplied, said bit line being supplied with one of a first voltage and a second voltage lower than said first voltage when a predetermined charge is set to said capacitor; and
plate voltage setting means for setting a value of said plate voltage,
wherein said plate voltage is such that a leakage current of a charge stored in said capacitor when said bit line is supplied with said first voltage is made substantially equal to a leakage current of a charge stored in said capacitor when said bit line is supplied with said second voltage;
comprising a reference voltage generating circuit having said plate voltage setting means, said reference voltage generating circuit generating a reference voltage from a predetermined voltage, and a plate voltage output circuit for forming said plate voltage from said reference voltage, wherein said plate voltage setting means contains fuse means fixable in a hardware approach.

4. A dynamic memory device according to claim 3, wherein said reference voltage generating circuit has a plurality of resistors connected in series between said first voltage and said second voltage lower than said first voltage and a plurality of fuses connected to said plurality of resistors in parallel, wherein a predetermined fuse of said plurality of fuses is fused to set said reference voltage to a predetermined level corresponding to said plate voltage.

5. A method of setting a plate voltage of a dynamic memory device formed on one semiconductor substrate, wherein said dynamic memory device comprises
a memory cell having a metal-oxide semiconductor field-effect transistor having a source-drain path having two ends with one end connected to a bit line and a gate connected to a word line and a capacitor having a first pole connected to the other end of said source-drain path of said metal-oxide semiconductor field-effect transistor and a second pole through which a plate voltage is supplied,
said method comprising the steps of:
(a) forming said dynamic memory device and a monitoring capacitor on a semiconductor wafer, said monitor capacitor having a third pole and a fourth pole, said capacitor and said monitoring capacitor being manufactured by a same method and made of a same material;
(b) measuring a leakage current of said monitoring capacitor if a voltage of said third pole is higher than a voltage of said fourth pole and a leakage current of said monitoring capacitor if the voltage of said fourth pole is higher than the voltage of said third pole; and
(c) setting a value of said plate voltage to a predetermined value in a fixed manner based on a result of said measuring step.

6. A method of setting a plate voltage according to claim 5, wherein said plate voltage setting step (c) sets said plate voltage such that a leakage current of said capacitor obtained if the voltage of said first pole is higher than the voltage of said second pole is made substantially equal to a leakage current of said capacitor obtained if the voltage of said second pole is higher than the voltage of said first pole.

7. A dynamic memory device according to claim 5, wherein said metal-oxide semiconductor field-effect transistor is of n-channel type.

8. A dynamic memory device according to claim 5, wherein said word line and said bit line extend in an orthogonal manner.

9. A method of setting a plate voltage of a dynamic memory device, wherein said dynamic memory device comprises:
a memory cell having a metal-oxide semiconductor field-effect transistor having a source-drain path having two ends of which one end is connected to a bit line and a gate connected to a word line, and an information storage capacitor having a first pole connected to the other end of said source-drain path of said metal-oxide semiconductor field-effect transistor and having a second pole to which a plate voltage is supplied; and
a voltage generator having a programming circuit, said voltage generator generating said plate voltage having a predetermined level, said predetermined level being determined in accordance with the state of said programming circuit,
said method comprising the steps of:
(a) forming said dynamic memory device and a monitoring capacitor on a semiconductor wafer, said monitoring capacitor having a third pole and a fourth pole, said information storage capacitor and said monitoring capacitor being manufactured by a same method and made of a same material;
(b) measuring a voltage difference between said third pole and said fourth pole when a voltage level of said third pole is higher than that of said fourth pole and a leakage current of said monitoring capacitor is a predetermined value;

(c) measuring a voltage difference between said third pole and said fourth pole when a voltage level of said fourth pole is higher than that of said third pole and a leakage current of said monitoring capacitor is said predetermined value; and (d) setting the state of said programming circuit in a fixed manner based on a result of said measuring steps (b) and (c).

10. A method of setting a plate voltage according to claim 9, wherein said plate voltage setting step (d) sets said plate voltage such that a leakage current of said information storage capacitor obtained if the voltage of said first pole is higher than the voltage of said second pole is made substantially equal to a leakage current of said information storage capacitor obtained if the voltage of said second pole is higher than the voltage of said first pole.

11. A method of setting a plate voltage according to claim 10, wherein said programming circuit comprises a fuse.

12. A method of setting a plate voltage according to claim 10, wherein said voltage generator comprises:

a reference voltage generating circuit outputting a reference voltage; and wherein said programming circuit comprises a plate voltage output circuit receiving said reference voltage and outputting said plate voltage.

13. A method of setting a plate voltage according to claim 9, wherein said voltage generator comprises:

a reference voltage generating circuit outputting a reference voltage, wherein said programming circuit is comprised of a plate voltage output circuit receiving said reference voltage and outputting said plate voltage.

14. A method of setting a plate voltage according to claim 13, wherein said programming circuit comprises a first fuse and a second fuse, wherein said reference voltage generation circuit further comprises:

a first resistor having a current path coupled between a first terminal receiving a supply voltage and an output terminal of said reference voltage generation circuit, said reference voltage being outputted from said output terminal; and a second resistor having a current path coupled between said output terminal and a second terminal receiving a ground potential, said first fuse being arranged in parallel connection with respect to said first resistor, and said second fuse being arranged in parallel connection with respect to said second resistor.

* * * * *